(12) United States Patent
Uchida

(10) Patent No.: US 8,122,418 B2
(45) Date of Patent: Feb. 21, 2012

(54) CAPACITOR ARRANGEMENT METHOD AND LAYOUT APPARATUS

(75) Inventor: Kohei Uchida, Tokyo (JP)

(73) Assignee: NEC Corporation, Tokyo (JP)

( * ) Notice: Subject to any disclaimer, the term of this patent is extended or adjusted under 35 U.S.C. 154(b) by 316 days.

(21) Appl. No.: 12/588,102

(22) Filed: Oct. 5, 2009

(65) Prior Publication Data

US 2010/0064268 A1   Mar. 11, 2010

(30) Foreign Application Priority Data

Oct. 9, 2008  (JP) ................................. 2008-262713

(51) Int. Cl.
*G06F 17/50* (2006.01)

(52) U.S. Cl. .......................... 716/122; 716/135; 716/136

(58) Field of Classification Search .......................... None
See application file for complete search history.

(56) References Cited

U.S. PATENT DOCUMENTS

| 6,775,812 | B2 * | 8/2004 | Cloudman et al. ............ 716/112 |
| 7,222,320 | B2 | 5/2007 | Ogawa |
| 7,358,555 | B2 | 4/2008 | Iwamatsu et al. |
| 7,458,047 | B2 | 11/2008 | Uchida |
| 7,849,433 | B2 * | 12/2010 | Chadwick et al. ............ 716/102 |
| 2002/0109205 | A1 | 8/2002 | Sawada et al. |
| 2006/0259888 | A1 | 11/2006 | McClellan et al. |
| 2007/0038968 | A1 | 2/2007 | Braun et al. |
| 2008/0135978 | A1 | 6/2008 | Furuta |

FOREIGN PATENT DOCUMENTS

| JP | 2002-246548 | 8/2002 |
| JP | 2005-340347 | 12/2005 |
| JP | 2006-40962 | 2/2006 |
| JP | 2006-261365 | 9/2006 |
| JP | 2006-303377 | 11/2006 |
| JP | 2008-147338 | 6/2008 |

OTHER PUBLICATIONS

Combined Search and Examination Report dated Jan. 21, 2010.

* cited by examiner

*Primary Examiner* — Leigh Garbowski
(74) *Attorney, Agent, or Firm* — McGinn IP Law Group, PLLC

(57) ABSTRACT

A layout apparatus stores a plurality of capacitor cells which are classifiable into a first classification for identifying capacitor cells having different sizes by frequency characteristic correlating with gate width of a capacitor and a second classification for identifying capacitor cells having different frequency characteristics by cell size. The layout apparatus: recognizes a plurality of combinations of a directed frequency characteristic and arrangement area; selects, for each of the combinations, capacitor cells corresponding to the directed frequency characteristic based on the first classification; reads out the capacitor cells in the descending order of cell size from the selected capacitor cells; arranges the read out capacitor cells to fill the directed arrangement area; checks a violation of capacitor density for all the directed arrangement areas of the plurality of combinations; replaces, when detecting the violation, a capacitor cell having larger gate width out of the arranged capacitor cells with a capacitor cell having smaller gate width besides the same cell size as the capacitor cell having larger gate width in accordance with the second classification; and retries checking the violation of capacitor density after finishing the replacement.

9 Claims, 4 Drawing Sheets

CELL LIST

First Classification

| FREQUENCY CHARACTERISTIC | CELL |
|---|---|
| CELL FOR HIGH FREQUENCY (CH) | CH22→CH41→CH21→CH11 |
| CELL FOR LOW FREQUENCY (CL) | CL41→CL21 |

Second Classification

| CELL SIZE | CELL |
|---|---|
| 2 X 2 | CH22 |
| 4 X 1 | CH41, CL41 |
| 2 X 1 | CH21, CL21 |
| 1 X 1 | CH11 |

FIG. 2

CAPACITOR ARRANGEMENT METHOD AND LAYOUT APPARATUS

TECHNICAL FIELD

The present invention relates to a technique of arranging, in LSI layout design, capacitors used for reducing noise.

BACKGROUND ART

As the operating frequency of an LSI is increased, power-supply noise inside the LSI is increased. In order to reduce the power-supply noise, a capacitor element called on-chip capacitor or decoupling capacitor is formed on a power-supply line of the LSI. PTL 1 discloses a technique concerning the layout of such capacitor elements.

The technique disclosed in PTL 1 is a technique in which a target area in which a decoupling capacitance is formed is divided into a plurality of areas, and unit cells of the decoupling capacitance are arranged in each area. At this time, the unit cells are laid out such that the power consumption in each area does not exceed an average value that has previously been calculated.

CITATION LIST

Patent Literature

{PTL 1} JP-A-2006-040962

SUMMARY OF INVENTION

Technical Problem

In the technique of PTL 1, each unit cell to be laid out is a cell of a predetermined single-size. The smaller the size of each unit cell, the more convenient it is for the unit cells to be arranged in a small area. However, in the case where small cells are arranged in a large area, a large number of cells are required, complicating the arrangement pattern and subsequent manufacturing process. On the contrary, a larger cell size is convenient for the unit cells to be arranged in a larger area but inconvenient in a smaller area. Thus, achievement in efficient layout is likely to be difficult depending on the size setting of the unit cell.

Further, in order to achieve noise reduction, measures based on the frequency of the noise are required. However, PTL1 does not consider the frequency of noise.

Thus, the present invention relates to the layout of capacitor cells, and an object thereof is to provide a capacitor arrangement method and a layout apparatus capable of achieving both efficiency in layout design and frequency-based noise reduction.

Solution to Problem

According to a first aspect of the present invention, there is provided a capacitor arrangement method, including: storing a plurality of capacitor cells which are classifiable into a first classification for identifying capacitor cells having different sizes by frequency characteristic correlating with gate width of a capacitor and a second classification for identifying capacitor cells having different frequency characteristics by cell size; recognizing a plurality of combinations of a directed frequency characteristic and arrangement area; selecting, for each of the combinations, capacitor cells corresponding to the directed frequency characteristic based on the first classification, reading out the capacitor cells in the descending order of cell size from the selected capacitor cells, and arranging the read out capacitor cells to fill the directed arrangement area; checking a violation of capacitor density for all the directed arrangement areas of the plurality of combinations; replacing, when detecting the violation, a capacitor cell having larger gate width out of the arranged capacitor cells with a capacitor cell having smaller gate width besides the same cell size as the capacitor cell having larger gate width in accordance with the second classification; and retrying checking the violation of capacitor density after finishing the replacement.

According to a second aspect of the present invention, there is provided a layout apparatus including: a storage section storing a plurality of capacitor cells which are classifiable into a first classification for identifying capacitor cells having different sizes by frequency characteristic correlating with gate width of a capacitor and a second classification for identifying capacitor cells having different frequency characteristics by cell size; and a layout section: recognizing a plurality of combinations of a directed frequency characteristic and arrangement area; selecting, for each of the combinations, capacitor cells corresponding to the directed frequency characteristic based on the first classification; reading out the capacitor cells in the descending order of cell size from the selected capacitor cells; arranging the read out capacitor cells to fill the directed arrangement area; checking a violation of capacitor density for all the directed arrangement areas of the plurality of combinations; replacing, when detecting the violation, a capacitor cell having larger gate width out of the arranged capacitor cells with a capacitor cell having smaller gate width besides the same cell size as the capacitor cell having larger gate width in accordance with the second classification; and retrying checking the violation of capacitor density after finishing the replacement.

Advantageous Effects of Invention

According to the present invention, it is possible to achieve both efficiency in layout design and frequency-based noise reduction in the layout of capacitor cells.

BRIEF DESCRIPTION OF DRAWINGS

FIG. 2 is an explanatory view concerning a sell list in the embodiment.

DESCRIPTION OF EMBODIMENTS

An embodiment of the present invention will be described in detail below with reference to the accompanying drawings. The present embodiment assumes two types of frequencies: high frequency and low frequency as a frequency band of noise to be reduced by means of an on-chip capacitor arranged in LSI. For example, a frequency band of 1 GHz or more may be defined as high frequency, and frequency band of less than 1 GHz may be defined as low frequency.

Figure 4:
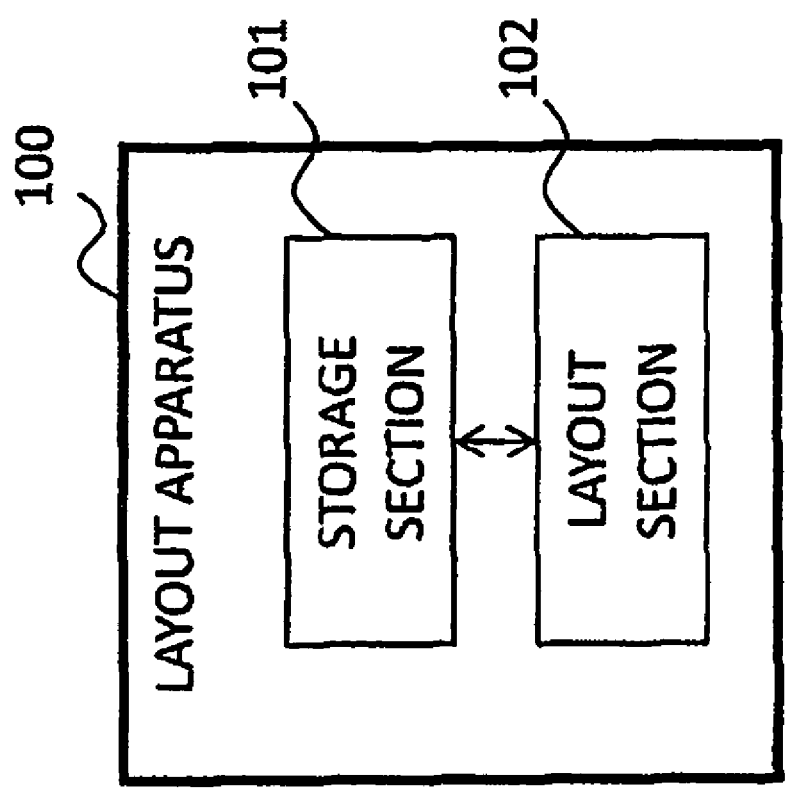
FIG. 4 is a configuration of a layout apparatus in the embodiment.

FIG. 4 shows a configuration of a layout apparatus 100 according to the present invention. A storage section 101 stores a cell list indicating a plurality of types of capacitor cells used as capacitor models, classification of the capacitor cells, and the like. A layout section 102 executes layout of the capacitor cells read out from the storage section 101 according to a procedure to be described later.

Figure 1:
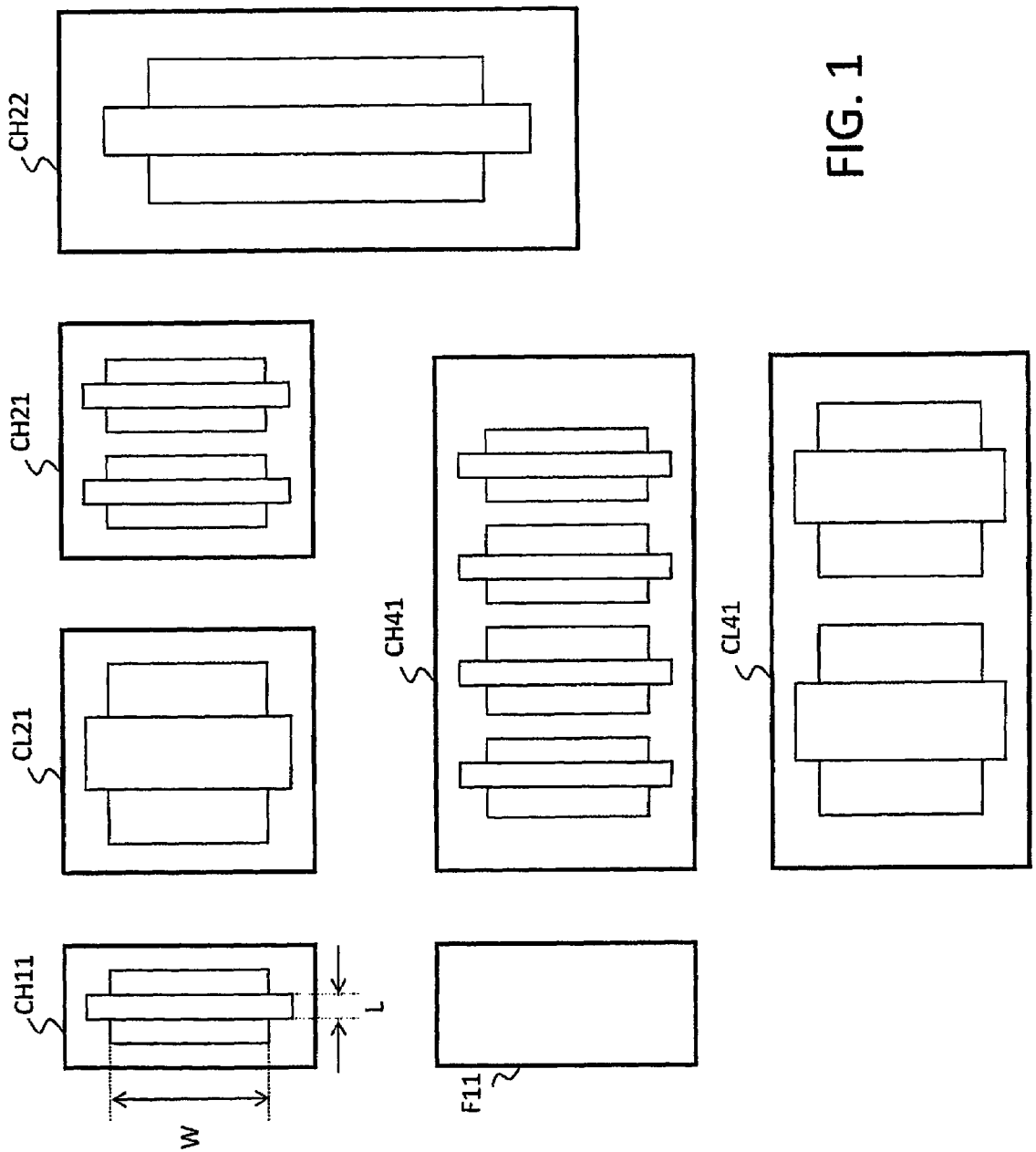
FIG. 1 is an explanatory view concerning a capacitor cell in an embodiment of the present invention.

FIG. 1 shows a configuration of a capacitor cell. In this example, with the size of a cell CH11 for high frequency set as a reference (1×1), a cell (CH--) for high frequency and a cell (CL--) for low frequency are prepared. Further, a fill cell F11 serving as a blank cell used at the time of density violation is prepared. The size type includes 2×1 type obtained by doubling the cell width of the reference size, 4×1 type obtained by quadrupling the cell width of the reference size, and 2×2 type obtained by doubling both the cell width and cell height of the reference size.

The frequency characteristic of each capacitor cell is defined by a width "W" of a transistor in the cell and a gate width "L" of the transistor. An on-chip capacitor having a smaller gate width L is suitable for higher-frequency noise reduction. Thus, in the present embodiment, the gate width L of the capacitor cell for high frequency is designed smaller than that of the capacitor cell for low frequency. In the cell for high frequency, the capacitor density in the cell, that is, a ratio of the area occupied by a capacitor pattern including a transistor and a wiring relative to the total area of the cell is set lower than in the cell for low frequency.

Further, in the case where two capacitor cells have the same frequency characteristic and same aspect ratio of the transistor width W and gate width L, a cell having a larger size has less dead space in the cell and higher capacitor density. Specifically, comparing cells CH11 and CH22 for high frequency, cell CH22 having a cell size larger than cell CH11 has a higher capacitor density.

FIG. 2 shows an example of the cell list for identifying the capacitor cells. A cell list 10 includes a first classification 11 classifying the capacitor cells by frequency characteristic and a second classification 12 classifying the capacitor cells by cell size. In the first classification 11, the capacitor cells of respective categories are listed in descending order of cell size. In the case of "CELL FOR HIGH FREQUENCY", the capacitor cells are listed starting from cell CH22 having the largest size, followed by cell CH41, cell CH21, and cell CH11 in the order mentioned. According to this listing order, the cells are read out in layout operation to be described later. In the second classification 12, the cells are classified by cell size.

Figure 3:
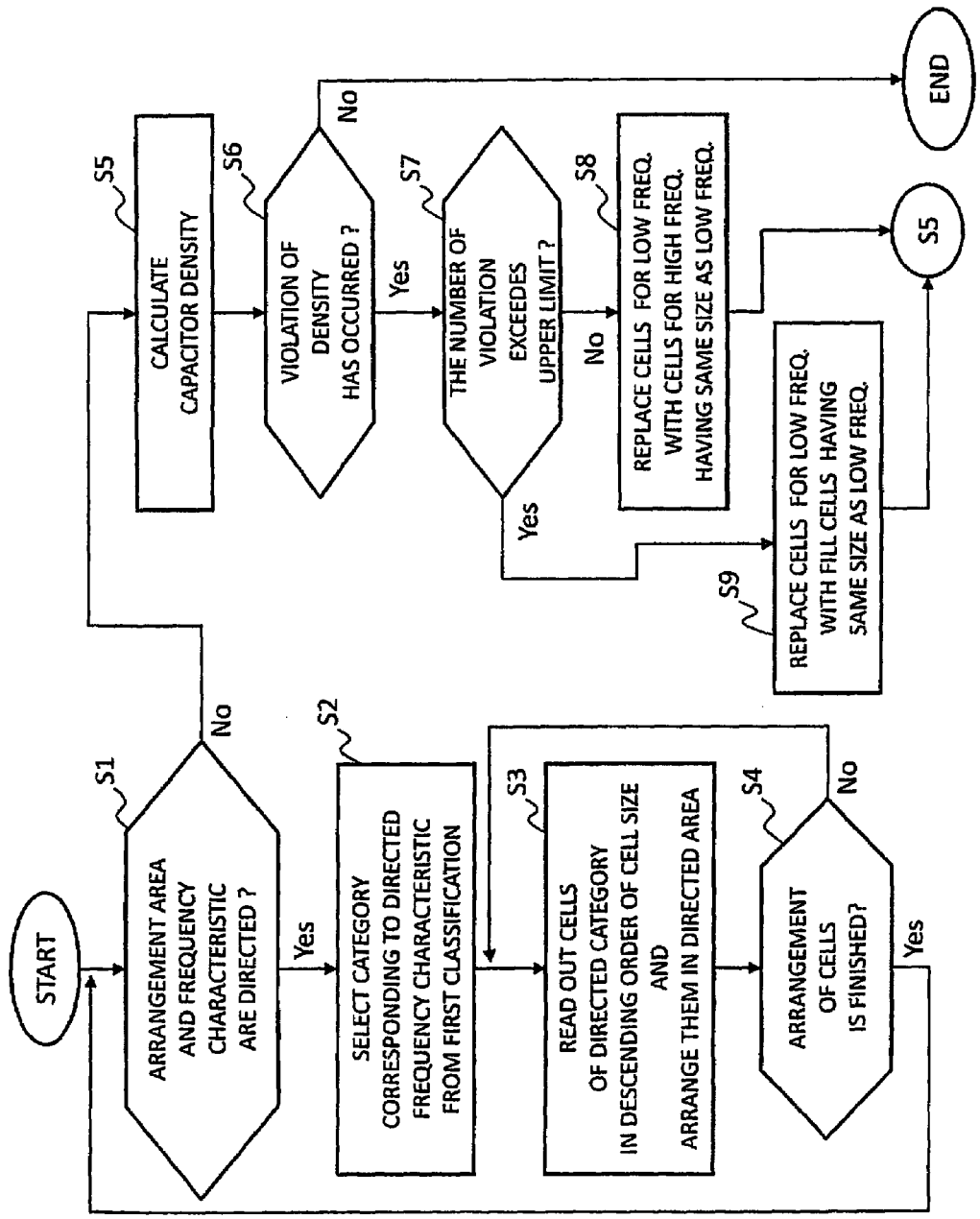
FIG. 3 is a flowchart showing an operation procedure in the embodiment.

A layout procedure for arranging the capacitor cells in an LSI will be described with reference to a flowchart of FIG. 3. When recognizing that the frequency characteristic and arrangement area have been directed (step S1), the layout section 102 of the layout apparatus 100 refers to the cell list 10 (FIG. 2) stored in the storage section 101 and selects, from the first classification 11, the category corresponding to the directed frequency characteristic (step S2). For example, in the case where high frequency is directed as the frequency characteristic, the layout section 102 selects the category of "for high frequency" from the first classification 11.

The layout section 102 uses the capacitor cells of the selected category to sequentially arrange the capacitor cells so as to fill the directed area. The capacitor cells to be arranged are read out from the storage section 101 in the order corresponding to the cell list 10 (step S3). If the "CELL FOR HIGH FREQUENCY" is directed, cell CH22 is arranged first in the arrangement area. If there remains a space smaller than the cell size of CH22, the layout section 102 tries to arrange, in the space, the subsequent cells CH41, CH21, and CH11 in the same category in the order mentioned. In this manner, the layout section 102 fills the arrangement area with capacitor cells for high frequency (Step S4: No→S3).

After finishing the arrangement of the capacitor cells in the directed area (step S4: Yes), the layout section 102 checks whether frequency characteristic and arrangement area are newly directed. In the case where the layout section 102 recognizes a new direction (step S1: Yes), the layout section 102 arranges the capacitor cells of the directed frequency characteristic in the directed arrangement area in the descending order of cell size (steps S2 to S4).

In the case where there is no further direction as to frequency characteristic and arrangement area (step S1: No), the layout section 102 checks, based on a predetermined design rule, whether there is a density violation in the current layout. To this end, the layout section 102 calculates the capacitor density in all the arrangement areas (step S5). In the case where the calculated density does not exceed a specified value, the layout section 102 determines that there is no violation (step S6: No), that is, determines that the layout has been made properly and ends the processing.

On the other hand, in the case where the calculated capacitor density exceeds the specified value, the layout section 102 determines that there is a density violation in the current layout (step S6: Yes). When detecting the violation, the layout section 102 replaces cells having a high capacitor density with cells having a low capacitor density, and retries the density calculation. As described above, a cell for high frequency has a smaller gate width besides a lower capacitor density as compared to a cell for low frequency. Thus, in the present embodiment, when there occurs a density violation, the cells for low frequency are replaced by the cells for high frequency or fill cells so as to reduce the density.

Then, the layout section 102 checks whether the number of violations has exceeded the upper limit. In the case where the number of violations at the current time point is less than the upper limit (step S7: No), the layout section 102 replaces cells for low frequency with cells for high frequency having the same cell size as that of the cells for low frequency (step S8). The cells having the same cell size are listed on the second classification 12 of the cell list 10 (FIG. 2). For example, cell CL21 of 2×1 type for low frequency is replaced by the same 2×1 type cell CH21 for high frequency. After finishing the replacement, the layout section 102 retries the density calculation in the current layout (step S5) and determines presence/absence of a violation.

Although the above replacement of the cell may be performed for all the cells for low frequency, it may be performed for some cells for low frequency. This allows the density to be reduced gradually.

On the other hand, in the case where the number of violations has exceeded the upper limit (step S7: Yes), a given cell for low frequency is replaced by fill cells having the same size as that of the given cell for low frequency (step S9). Also in this case, all the cells for low frequency may be replaced by the fill cells or only some cells for low frequency may be replaced by the fill cells. In the case where the density violation occurs even when all the cells for low frequency have been replaced by the fill cells, some cells for high frequency may be replaced by the fill cells, for example. After completion of the replacement, the layout section 102 performs the density calculation once again (step S5).

According to the present embodiment, capacitors corresponding to the assumed frequency band of noise are arranged, thereby increasing noise reduction accuracy. Further, cells having the same frequency characteristic and different sizes are prepared, and the capacitors are arranged in the descending order of cell size, whereby layout operation can be made efficient. Therefore, both efficiency in layout design and frequency-based noise reduction can be achieved.

The present invention is not limited to the above embodiment, but various modifications may be made within the spirit of the present invention. For example, although two types of frequencies: high frequency and low frequency are assumed as the frequency characteristic of the capacitor, the number of types of frequencies may be three or more. Also in that case, the gate width of the capacitor in the cell having a higher frequency is made smaller.

The present invention can be implemented also as a computer program corresponding to the operation (FIG. 3) of the layout section 102 in the above embodiment or a recording medium storing the program. When the above implementation is realized, the program is stored in the recording medium, and computer reads out the program from the recording medium and executes it.

This application is based upon and claims the benefit of priority from Japanese patent application No. 2008-262713, filed on Oct. 9, 2008, the disclosure of which is incorporated herein its entirety by reference.

REFERENCE SIGNS LIST

CH11, CL21, CH21, CH22, CL41, CH41: Capacitor cell
F11: Fill cell (blank cell)
L: Gate width
W: Transistor width
10: Cell list
11: First classification
12: Second classification

The invention claimed is:

1. A capacitor arrangement method, comprising steps of:
storing a plurality of capacitor cells which are classifiable into a first classification for identifying capacitor cells having different sizes by frequency characteristic correlating with gate width of a capacitor and a second classification for identifying capacitor cells having different frequency characteristics by cell size;
recognizing a plurality of combinations of a directed frequency characteristic and arrangement area;
selecting, for each of the combinations, capacitor cells corresponding to the directed frequency characteristic based on the first classification, reading out the capacitor cells in the descending order of cell size from the selected capacitor cells, and arranging the read out capacitor cells to fill the directed arrangement area;
checking a violation of capacitor density for all the directed arrangement areas of the plurality of combinations;
replacing, when detecting the violation, a capacitor cell having larger gate width out of the arranged capacitor cells with a capacitor cell having smaller gate width besides the same cell size as the capacitor cell having larger gate width in accordance with the second classification; and
retrying checking the violation of capacitor density after finishing the replacement.

2. The capacitor arrangement method according to claim 1, further comprising steps of:
storing blank cells by cell size;
determining whether the number of violations has exceeded the upper limit; and
replacing, when the number of violations exceeds the upper limit, a capacitor cell having larger gate width out of the arranged capacitor cells with a blank cell having the same cell size as the capacitor cell having larger gate width.

3. The capacitor arrangement method according to claim 1, wherein
the frequency characteristic concerning each of the first and second classifications is characteristic of a high frequency band or a low frequency band against noise, and
the gate width correlating with the characteristic of the high frequency band is smaller than the gate with correlating width the characteristic of the low frequency.

4. A layout apparatus comprising:
a storage section storing a plurality of capacitor cells which are classifiable into a first classification for identifying capacitor cells having different sizes by frequency characteristic correlating with gate width of a capacitor and a second classification for identifying capacitor cells having different frequency characteristics by cell size; and
a layout section: recognizing a plurality of combinations of a directed frequency characteristic and arrangement area; selecting, for each of the combinations, capacitor cells corresponding to the directed frequency characteristic based on the first classification; reading out the capacitor cells in the descending order of cell size from the selected capacitor cells; arranging the read out capacitor cells to fill the directed arrangement area; checking a violation of capacitor density for all the directed arrangement areas of the plurality of combinations; replacing, when detecting the violation, a capacitor cell having larger gate width out of the arranged capacitor cells with a capacitor cell having smaller gate width besides the same cell size as the capacitor cell having larger gate width in accordance with the second classification; and retrying checking the violation of capacitor density after finishing the replacement.

5. The layout apparatus according to claim 4, wherein
the storage section stores blank cells by cell size, and
the layout section: determines whether the number of violations has exceeded the upper limit; and replaces, when the number of violations exceeds the upper limit, a capacitor cell having larger gate width out of the arranged capacitor cells with a blank cell having the same cell size as the capacitor cell having larger gate width.

6. The layout apparatus according to claim 4, wherein
the frequency characteristic concerning each of the first and second classifications is a characteristic of a high frequency band or a low frequency band against noise, and
the gate width correlating with the characteristic of the high frequency band is smaller than the gate width correlating with the characteristic of the low frequency.

7. A non-transitory computer-readable medium stored therein a program causing a computer to implement steps of:
storing a plurality of capacitor cells which are classifiable into a first classification for identifying capacitor cells having different sizes by frequency characteristic correlating with gate width of a capacitor and a second classification for identifying capacitor cells having different frequency characteristics by cell size;
recognizing a plurality of combinations of a directed frequency characteristic and arrangement area;
selecting, for each of the combinations, capacitor cells corresponding to the directed frequency characteristic based on the first classification, reading out the capacitor cells in the descending order of cell size from the selected capacitor cells, and arranging the read out capacitor cells to fill the directed arrangement area;
checking a violation of capacitor density for all the directed arrangement areas of the plurality of combinations;
replacing, when detecting the violation, a capacitor cell having larger gate width out of the arranged capacitor cells with a capacitor cell having smaller gate width besides the same cell size as the capacitor cell having larger gate width in accordance with the second classification; and retrying checking the violation of capacitor density after finishing the replacement.

8. The computer-readable medium according to claim 7, wherein the program further comprises steps of:

storing blank cells by cell size;

determining whether the number of violations has exceeded the upper limit; and replacing, when the number of violations exceeds the upper limit, a capacitor cell having larger gate width out of the arranged capacitor cells with a blank cell having the same cell size as the capacitor cell having larger gate width.

9. The computer-readable medium according to claim 8, wherein the frequency characteristic concerning each of the first and second classifications is characteristic of a high frequency band or a low frequency band against noise, and the gate width correlating with the characteristic of the high frequency band is smaller than the gate with correlating width the characteristic of the low frequency.

* * * * *